United States Patent
Woychik et al.

(10) Patent No.: US 9,953,910 B2
(45) Date of Patent: Apr. 24, 2018

(54) DEMOUNTABLE INTERCONNECT STRUCTURE

(75) Inventors: Charles Gerard Woychik, Niskayuna, NY (US); Raymond Albert Fillion, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1751 days.

(21) Appl. No.: 12/061,141

(22) Filed: Apr. 2, 2008

(65) Prior Publication Data

US 2008/0318027 A1    Dec. 25, 2008

Related U.S. Application Data

(63) Continuation-in-part of application No. 11/766,356, filed on Jun. 21, 2007.

(51) Int. Cl.
  *H01L 23/498* (2006.01)
  *H01L 23/00* (2006.01)
  *H01L 23/538* (2006.01)

(52) U.S. Cl.
  CPC ........ *H01L 23/49822* (2013.01); *H01L 24/19* (2013.01); *H01L 24/20* (2013.01);
  (Continued)

(58) Field of Classification Search
  CPC .......... H01L 24/26; H01L 24/30; H01L 24/33
  See application file for complete search history.

(56) References Cited

U.S. PATENT DOCUMENTS

| 4,630,096 A | 12/1986 | Drye et al. |
| 4,722,914 A | 2/1988 | Drye et al. |

(Continued)

FOREIGN PATENT DOCUMENTS

| EP | 1474959 B1 | 5/2005 |
| EP | 1617714 A1 | 1/2006 |

(Continued)

OTHER PUBLICATIONS

Hoban et al., Soldering, Spring 1997, the Technology Interface downloaded on 4-7-20011 from http://engr.nmsu.edu/~etti/spring97/electronics/solder/solder.html.*

(Continued)

*Primary Examiner* — Elizabeth A Robinson
(74) *Attorney, Agent, or Firm* — Ziolkowski Patent Solutions Group, SC

(57) ABSTRACT

An electronic component includes a base insulative layer having first and second surfaces; an electronic device having first and second surfaces; at least one I/O contact located on the first surface of the electronic device; an adhesive layer disposed between the first surface of the electronic device and the second surface of the base insulative layer; a first metal layer disposed on the I/O contact; and a removable layer disposed between the first surface of the electronic device and the second surface of the base insulative layer, and located adjacent to the first metal layer. The base insulative layer secures to the electronic device through the first metal layer and removable layer. The first metal layer and removable layer can release the base insulative layer from the electronic device when the first metal layer and removable layer are exposed to a temperature higher than their softening points or melting points.

4 Claims, 11 Drawing Sheets

(52) U.S. Cl.
CPC ........ *H01L 24/31* (2013.01); *H01L 23/49816* (2013.01); *H01L 23/5389* (2013.01); *H01L 24/81* (2013.01); *H01L 2224/0401* (2013.01); *H01L 2224/04105* (2013.01); *H01L 2224/13099* (2013.01); *H01L 2224/16225* (2013.01); *H01L 2224/20* (2013.01); *H01L 2224/32225* (2013.01); *H01L 2224/73204* (2013.01); *H01L 2224/73267* (2013.01); *H01L 2224/81801* (2013.01); *H01L 2224/83132* (2013.01); *H01L 2224/92144* (2013.01); *H01L 2924/0103* (2013.01); *H01L 2924/01005* (2013.01); *H01L 2924/0105* (2013.01); *H01L 2924/01006* (2013.01); *H01L 2924/01011* (2013.01); *H01L 2924/01013* (2013.01); *H01L 2924/01015* (2013.01); *H01L 2924/01019* (2013.01); *H01L 2924/01022* (2013.01); *H01L 2924/01024* (2013.01); *H01L 2924/01027* (2013.01); *H01L 2924/01029* (2013.01); *H01L 2924/01032* (2013.01); *H01L 2924/01033* (2013.01); *H01L 2924/01047* (2013.01); *H01L 2924/01057* (2013.01); *H01L 2924/01074* (2013.01); *H01L 2924/01078* (2013.01); *H01L 2924/01079* (2013.01); *H01L 2924/01082* (2013.01); *H01L 2924/09701* (2013.01); *H01L 2924/10253* (2013.01); *H01L 2924/12042* (2013.01); *H01L 2924/14* (2013.01); *H01L 2924/1433* (2013.01); *H01L 2924/1517* (2013.01); *H01L 2924/15153* (2013.01); *H01L 2924/15311* (2013.01); *H01L 2924/16195* (2013.01); *Y10T 428/26* (2015.01); *Y10T 428/31515* (2015.04); *Y10T 428/31663* (2015.04); *Y10T 428/31678* (2015.04)

(56) References Cited

U.S. PATENT DOCUMENTS

| | | |
|---|---|---|
| 4,783,695 A | 11/1988 | Eichelberger et al. |
| 4,901,136 A | 2/1990 | Neugebauer et al. |
| 4,918,811 A | 4/1990 | Eichelberger et al. |
| 4,894,115 A | 6/1990 | Eichelberger et al. |
| 4,933,042 A | 6/1990 | Eichelberger et al. |
| 4,981,811 A | 1/1991 | Feygenson et al. |
| 5,151,769 A | 9/1992 | Immorlica, Jr. et al. |
| 5,161,093 A | 11/1992 | Gorczyca et al. |
| 5,169,678 A | 12/1992 | Cole et al. |
| 5,169,911 A | 12/1992 | Lupinski et al. |
| 5,353,195 A | 10/1994 | Fillion et al. |
| 5,353,498 A | 10/1994 | Fillion et al. |
| 5,366,906 A | 11/1994 | Wojnarowski et al. |
| 5,434,751 A | 7/1995 | Cole et al. |
| 5,452,182 A | 9/1995 | Eichelberger et al. |
| 5,497,033 A | 3/1996 | Fillion et al. |
| 5,527,741 A | 6/1996 | Cole et al. |
| 5,745,984 A | 5/1998 | Cole, Jr. et al. |
| 5,822,856 A * | 10/1998 | Bhatt et al. ............. 29/832 |
| 5,866,952 A | 2/1999 | Wojnarowski et al. |
| 5,888,837 A | 3/1999 | Fillion et al. |
| 5,946,546 A | 8/1999 | Fillion et al. |
| 5,949,138 A | 9/1999 | Palasi et al. |
| 5,966,593 A | 10/1999 | Budnaitis et al. |
| 6,121,689 A | 9/2000 | Capote et al. |
| 6,222,279 B1 | 4/2001 | Mis et al. |
| 6,239,482 B1 | 5/2001 | Fillion et al. |
| 6,239,980 B1 | 5/2001 | Fillion et al. |
| 6,242,282 B1 | 6/2001 | Fillion et al. |
| 6,365,057 B1 | 4/2002 | Whitehurst et al. |
| 6,396,153 B2 | 5/2002 | Fillion et al. |
| 6,475,877 B1 | 11/2002 | Saia et al. |
| 6,489,185 B1 | 12/2002 | Towle et al. |
| 6,506,632 B1 | 1/2003 | Cheng et al. |
| 6,506,633 B1 | 1/2003 | Cheng et al. |
| 6,548,393 B1 | 4/2003 | Lin |
| 6,548,896 B2 | 4/2003 | Guida |
| 6,555,906 B2 | 4/2003 | Towle et al. |
| 6,566,234 B1 | 5/2003 | Capote et al. |
| 6,586,822 B1 | 7/2003 | Vu et al. |
| 6,639,314 B2 | 10/2003 | Boettcher et al. |
| 6,657,031 B1 | 12/2003 | Crane et al. |
| 6,713,859 B2 | 3/2004 | Ma |
| 6,734,534 B1 | 5/2004 | Vu et al. |
| 6,749,737 B2 | 6/2004 | Cheng et al. |
| 6,825,063 B2 | 11/2004 | Vu et al. |
| 6,838,776 B2 | 1/2005 | Leal et al. |
| 6,894,399 B2 | 5/2005 | Vu et al. |
| 6,933,493 B2 | 8/2005 | Hsin |
| 6,991,966 B2 | 1/2006 | Tuominen |
| 6,994,897 B2 | 2/2006 | Durocher et al. |
| 7,007,356 B2 | 3/2006 | Cudney et al. |
| 7,078,788 B2 | 7/2006 | Vu et al. |
| 7,170,162 B2 | 1/2007 | Chang |
| 7,183,658 B2 | 2/2007 | Towle et al. |
| 2002/0014703 A1 | 2/2002 | Capote et al. |
| 2002/0197771 A1 | 12/2002 | Dotta et al. |
| 2003/0013232 A1 | 1/2003 | Towle et al. |
| 2003/0170450 A1 * | 9/2003 | Stewart et al. ............. 428/343 |
| 2004/0113260 A1 | 6/2004 | Sunohara et al. |
| 2004/0226743 A1 | 11/2004 | Fang |
| 2005/0062173 A1 | 3/2005 | Vu et al. |
| 2006/0009009 A1 | 1/2006 | Hara |
| 2006/0186531 A1 | 8/2006 | Hsu |
| 2006/0198570 A1 | 9/2006 | Ogawa et al. |
| 2006/0258048 A1 | 11/2006 | Vrtis |
| 2006/0292377 A1 | 12/2006 | Hoffman et al. |
| 2007/0126122 A1 | 6/2007 | Bauer et al. |

FOREIGN PATENT DOCUMENTS

| | | |
|---|---|---|
| EP | 1650798 A2 | 4/2006 |
| EP | 1661717 A1 | 7/2006 |
| JP | 2002-057453 A | 2/2002 |
| JP | 2006-100457 A | 4/2006 |
| WO | WO03065778 A1 | 8/2003 |
| WO | WO2004077902 A1 | 9/2004 |
| WO | WO2004077903 A1 | 9/2004 |
| WO | WO2005027602 A1 | 3/2005 |
| WO | WO2006013230 A2 | 2/2006 |

OTHER PUBLICATIONS

Oxford English Dictionary adjacent definition, 1989, Oxford University Press.*
Threadingham et al., Ullmann's Encyclopedia of Industrial Chemistry Synthetic Rubber article, Apr. 30, 2004, Wiley-VCH Verlag GmbH & Co, pp. 1-146.*
Graf, Modern Dictionary of Electronics, 1992, Sixth Edition, pp. 1103 and 755.*
EP Search Report and Opinion dated Oct. 25, 2012 from corresponding EP Application No. 09156247.0.
EP Search Report and Opinion dated Oct. 25, 2012 from corresponding EP Application No. 09158248.8.
Office Action from corresponding JP Application No. 2009-075413, dated Apr. 2, 2013.

* cited by examiner

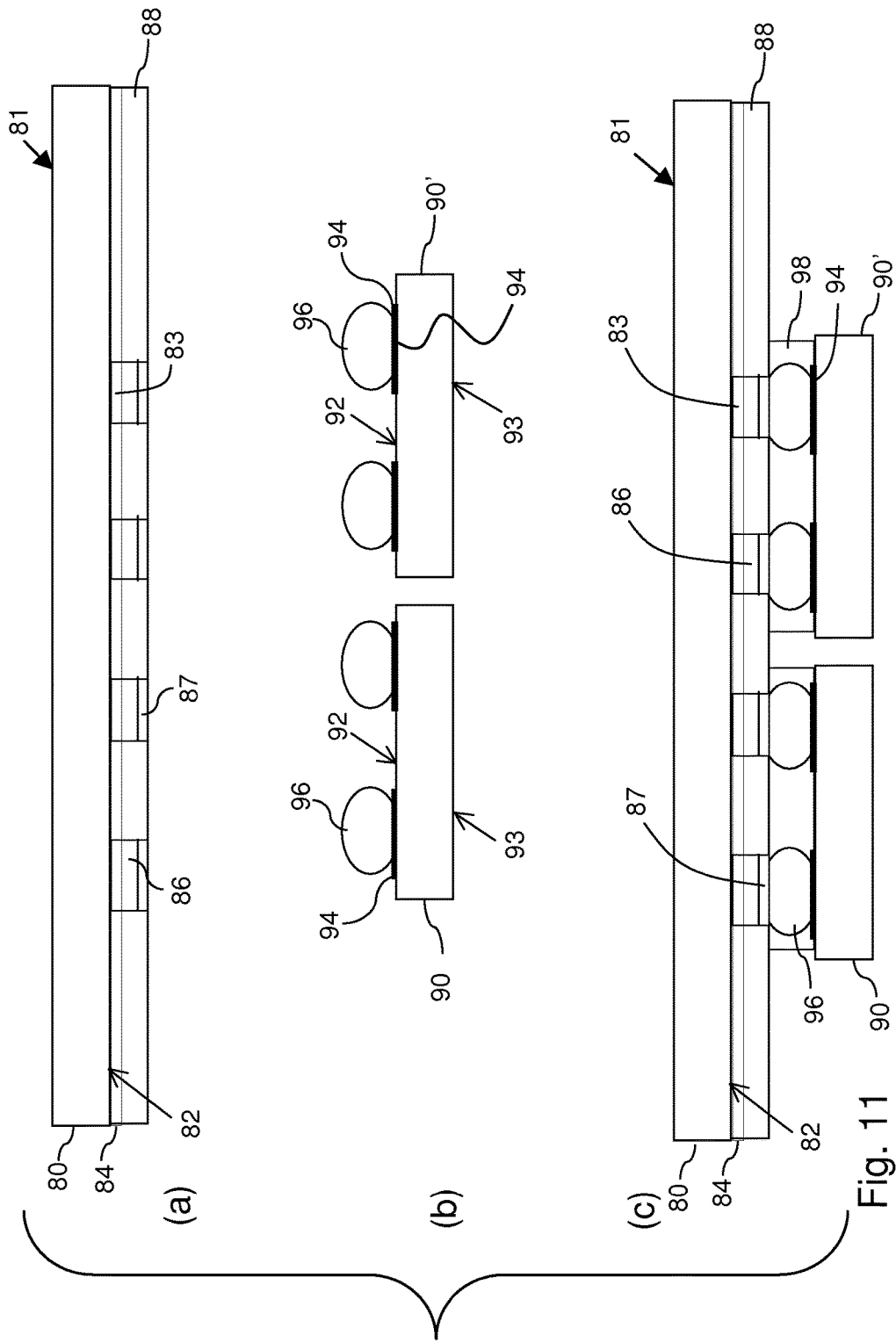

DEMOUNTABLE INTERCONNECT STRUCTURE

CROSS-REFERENCE TO RELATED APPLICATION

This application is a Continuation-In-Part of U.S. patent application Ser. No. 11/766,356 filed on Jun. 21, 2007, now abandoned.

TECHNICAL FIELD

The invention includes embodiments that relate to the fabrication of an interconnect structure. More particularly, the invention embodiments relate to a method of recovering a chip or other electrical component from an interconnect structure.

DISCUSSION OF ART

Bonding of electronic devices such as semiconductor chips, discrete passives, BGA carriers or other electrical elements onto printed circuit boards, substrates, interconnect structures or flex circuits is generally done with solders or adhesives. In an area array solder attach assembly, the electrical connections are made by raising the temperature to reflow the solder, which solidifies upon cooling. In applications where the coefficient of thermal expansion (CTE) of the electronic device is not a close match for the CTE of the substrate upon which it is attached, thermal cycling will stress the solder joints and may cause solder fatigue failure. One method to overcome this issue is to encase the solder joints with a polymer resin underfill such as a filled epoxy to stress relieve the solder joints. Dispensing liquid resin on one or more sides of a component and allowing the resin to flow under the component by capillary action can apply these underfills.

Electronic devices that are sensitive to exposure to high temperature, such as 200 degrees Celsius, should not use a high temperature thermoplastic bonding material. Furthermore, low temperature thermoplastics cannot be exposed to later processing steps such as curing, or to certain assembly steps that exceed their melt or softening temperature. As a result, thermoset adhesives are used in the processing of such electronic devices, because thermoset adhesives can be cured at relatively low temperatures (<200 degrees Celsius), yet are stable at higher temperatures during subsequent processing steps or in use environments. In addition, lower temperature adhesion and bonding may be preferred because the zero stress point is established at the bonding temperature, and a lower bonding temperature lowers the stresses in an interconnect assembly at normal operating temperatures.

If a number of electronic devices are attached to a common substrate and one of the devices is found to be defective after solder attach and underfill curing, it is generally desirable to remove the defective device and to replace it with a new part, thus salvaging the substrate and the other electronic devices located on the substrate. The problem with the use of a thermoset underfill resin is that a thermoset cannot be remelted at a normal processing temperature; thus, the defective electronic device is not removable and the entire circuit must be discarded. Accordingly, the use of low processing temperature, low stress thermoset adhesives results in a non-repairable processing step. Furthermore, the remeltable and reworkable thermoplastic resins may need high temperature processing, and may result in high stress structures that are not compatible with some uses.

Additionally, in embedded chip applications in which an interconnect structure is directly attached to the surface of electronic components a similar issue arises. In these applications, the use of a thermoplastic adhesive to bond the electronic component to the interconnect structure either stresses the structure excessively because of the high thermoplastic melt temperature or severely limits the components operating and/or assembly temperature because of a low thermoplastic melt temperature. In addition, the thermoplastic adhesive may turn liquid during chip to film bonding, permitting the chip to move during processing. Use of a thermoset adhesive in these applications reduces the stress and increases the operating and assembly temperature range, but makes recovery of the electronic component extremely difficult if not impossible.

In a current embedded chip process, referred to as Embedded Chip Build-Up (ECBU) or Chips First Build-Up (CFBU) technology, bare chips are packaged with perimeter or peripheral I/O pads or with an array of I/O pads distributed over the top surface into a high density interconnect structure without the need for either solder joints or wirebonds. The ECBU or CFBU process can be used to form a chip carrier that interconnects a complex semiconductor chip to larger contact pads that are compatible with board level assemblies such as printed circuit boards. These high-end chips may have a value of hundreds of dollars. Since all complex interconnect structures have processing defects such as electrical shorts and/or opens, they also have inherent yield losses. In conventional flip chip or wire bonded chip carrier assemblies, the interconnect structure is fully fabricated and electrically tested prior to assembling a costly chip. Thus, a defective interconnect structure does not cause the loss of a costly chip. In the ECBU process, the chip is bonded to the interconnect structure prior to the fabrication of the interconnect structure, potentially causing a good chip to be scrapped with a bad package.

BRIEF DESCRIPTION

In one embodiment, the invention provides an electronic component. The electronic component includes a base insulative layer having a first surface and a second surface; an electronic device having a first surface and a second surface; at least one I/O contact located on the first surface of the electronic device; an adhesive layer disposed between the first surface of the electronic device and the second surface of the base insulative layer; a first metal layer disposed on the I/O contact; and a removable layer disposed between the first surface of the electronic device and the second surface of the base insulative layer, and located adjacent to the first metal layer; wherein the base insulative layer secures to the electronic device through the first metal layer and removable layer, and wherein the first metal layer and removable layer are capable of releasing the base insulative layer from the electronic device when the first metal layer and removable layer are exposed to a temperature higher than their softening points or melting points.

In another embodiment, an electronic assembly comprises a base substrate having a first surface and a second surface; an electronic device having a first surface and a second surface; at least one contact pad located on the second surface of the base substrate; a first metal layer disposed on the contact pad; and a removable layer disposed between the second surface of the base substrate and the first surface of the electronic device, and located adjacent to the first metal layer; at least one I/O contact located on the first surface of the electronic device; at least one conductive element electrically connecting the at least one I/O contact to the at least one contact pad located on the base substrate; an underfill layer disposed between the first surface of the electronic device and the second surface of the base substrate; wherein the base substrate secures to the electronic device through the first metal layer and removable layer, and wherein the first metal layer and removable layer are capable of releasing the electronic device from the base substrate when the first metal layer and removable layer are exposed to a temperature higher than their softening points or melting points.

BRIEF DESCRIPTION OF THE DRAWINGS

FIG. 11(a) is a cross-sectional side view of an interconnect substrate in accordance with an alternative embodiment of this invention.

FIG. 11(b) is a cross-sectional side view of two chip scale electronic devices prior to placement onto an interconnect substrate in accordance with an alternative embodiment of the invention.

FIG. 11(c) is a cross-sectional view of two chip scale electronic devices mounted onto an interconnect substrate in accordance with an alternative embodiment of this invention.

DETAILED DESCRIPTION

Figure 1:
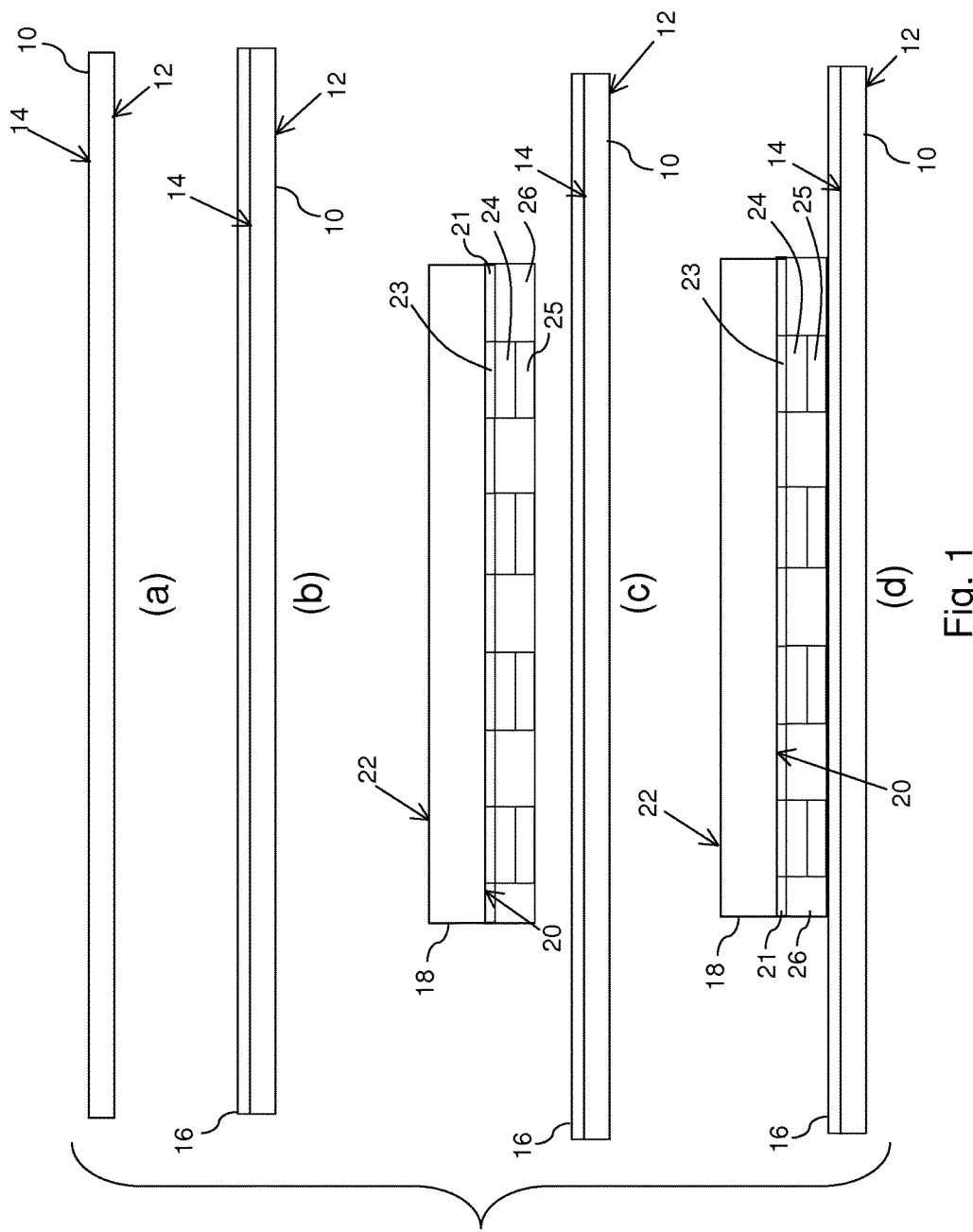
FIGS. 1(a)-1(d) are cross-sectional side views of an electronic device being bonded to a base insulative layer according to an embodiment of the invention.

The invention includes embodiments that relate to the fabrication of an electrical component or interconnect structure. The invention also includes embodiments that relate to a method of recovering a chip or other electrical device from the component. A method may provide for the recovery of an undamaged electronic device, such as a chip, from a defective interconnect structure or package. The methods may be useful in processes involving resin underfills and other embedded chip technology. However, the methods may be used in applications in which the recovery of an electronic device from an interconnect structure or package is desired.

The electronic component can include a base insulative layer having a first surface and a second surface; an electronic device having a first surface and a second surface, where the electronic device is secured to the base insulative layer. In the volume defined between the first surface of the electronic device and the second surface of the base insulative layer, there is an adhesive layer, a first metal layer, a removable layer, and optionally a second metal layer.

Suitable material for use as the base insulative layer may include one or more of polyimide, polyetherimide, benzocyclobutene (BCB), liquid crystal polymer, bismaleimide-triazine resin (BT resin), epoxy, or silicone. Suitable commercially available materials for use as the base insulative layer may include KAPTON® H polyimide or KAPTON® E polyimide (manufactured by E. I. du Pont de Nemours & Co.), APICAL® AV polyimide (manufactured by Kanegafugi Chemical Industry Company), UPILEX® polyimide (manufactured by UBE Industries, Ltd.), and ULTEM® polyetherimide (manufactured by General Electric Company). In the illustrated embodiment, the base insulative layer is fully cured as KAPTON® H polyimide.

The base insulative layer may form an interconnect structure, flex circuit, circuit board, or other structure. The interconnect structure can mount and interconnect with one or more electronic devices. With regard to one embodiment, selection properties for the base insulative layer include an elastic modulus and coefficients of thermal and humidity expansion that provide minimal dimensional change during processing. To maintain flexibility, the thickness of the base insulative layer may be minimized. The base insulative layer must have enough rigidity (due to either thickness, a support structure, or material characteristic) to support layers of metallization optionally on both the first and second surfaces, and to maintain dimensional stability through subsequent processing steps.

With regard to the thickness of the base insulative layer, suitable thickness may be selected with reference to the end-use application, the number and type of electronic devices, and the like. The thickness may be greater than about 10 micrometers. The thickness may be less than about 50 micrometers. In one embodiment, the base insulative layer has a thickness in a range of from about 10 micrometers to about 20 micrometers, from about 20 micrometers to about 30 micrometers, from about 30 micrometers to about 40 micrometers, from about 40 micrometers to about 50 micrometers, or greater than about 50 micrometers. With regard to one embodiment where the base insulative layer is a circuit board, its suitable thickness may be based on the number of layers within the circuit board. The number of circuit board layers generally ranges from about 2 to about 50 or more with each layer having a thickness of about 100 micrometers.

The adhesive layer is a thermoset adhesive. Examples of suitable adhesives may include a thermoset polymer. Suitable thermoset polymers may include an epoxy, silicone, acrylate, urethane, polyetherimide, or polyimide. Suitable commercially available thermoset adhesives may include a polyimide such as CIBA GEIGY 412 (manufactured by Ciba Geigy), AMOCO AI-10 (manufactured by Amoco Chemicals Corporation) and PYRE-MI (manufactured by E. I. du Pont de Nemours & Co.). CIBA GEIGY 412 has a glass transition temperature of about 360 degrees Celsius. Other suitable adhesives may include thermoplastic adhesives, water cure adhesives, air cure adhesives, and radiation cure adhesives.

The adhesive layer may be applied to form a layer having a thickness greater than about 5 micrometers on the base insulative layer surface. In one embodiment, the adhesive layer has a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers.

The adhesive layer may be applied to the base insulative layer by spin coating, spray coating, roller coating, meniscus coating, screen printing, stenciling, pattern print depositing, jetting, or by other dispensing method. In one embodiment, the adhesive is applied by dry film lamination. The adhesive layer may be applied to partially or fully cover the second surface of the base insulative layer. For example, the adhesive layer may be applied to selective areas on the base insulative surface, such as to electronic device mounting sites, while leaving uncoated another area on the base insulative layer surface, such as an electrical contact pad or an electrical test pads. This may be accomplished by direct dispense systems such as jetting, or by stencil or screen printing standard assembly processing steps used to selectively apply solder mask resins onto boards, substrates or components. The direct dispense process may deposit layers with a thickness that is less than about 50 micrometers, and the screen-printing technique may form deposited layers with a thickness that is greater than about 50 micrometers.

The adhesive layer may be applied to the electronic device subsequent to the application of the removable layer and first and second metal layers to the electronic device. Accordingly, the adhesive layer may be applied to a surface of the removable layer and a surface of the first metal layer or second metal layer. In one embodiment, the adhesive layer is deposited onto the electronic device in liquid form and may be dried. The adhesive layer may be applied by itself in liquid form, or may be deposited as part of a liquid solution, e.g. mixed with a solvent. In one example, a suitable liquid thermoset polymer may include 24.8% by weight CIBA GEIGY 412 in a liquid solution comprising 66.4% by weight N-mp, 0.59% by weight of a 0.1% solution of FC 430® (a surfactant commercially available from 3M Corporation) and 8.3% by weight DMAC. A droplet of this material may be dispensed onto the electronic device in sufficient volume to produce a coating of about 200 micrometers to about 1000 micrometers. After the adhesive layer solution is deposited, the material may be dried in a sequential series of thermal steps, such as 10 to 20 minutes at about 150 degrees Celsius, 10 to 20 minutes at about 220 degrees Celsius and 10 to 20 minutes at about 300 degrees Celsius. The number and duration of the thermal steps, as well as the temperatures used will depend on the particular thermoset polymer or other material that is utilized. This drying sequence removes the solvent from the thermoset adhesive solution, and leaves a fully dried layer of the adhesive layer on the electronic device. The thermoset polymer is fully cross-linked, no longer soluble in the solvent solution, and will not soften unless exposed to extremely high temperatures.

The adhesive layer may be fully cured, if necessary, to bond or secure the electronic device to the base insulative layer. A curing temperature below the melt temperatures of the removable layer and first and second metal layers should be used.

In one embodiment, the removable layer includes a thermoplastic polymer. Suitable thermoplastic polymers for use in forming the removable layer include, but are not limited to, a thermoplastic resin that include a polyolefin, polyimide, polyetherimide, polyether ether ketone, polyether sulfone, silicone, siloxane, or epoxy. Examples of suitable thermoplastic polymers include XU 412 (commercially available from Ciba Geigy); ULTEM 1000 and ULTEM 6000, which are polyetherimide resins manufactured by GE Plastics; VITREX a polyether ether ketone commercially available from Victrex; XU 218, a polyether sulfone commercially available from Ciba Geigy; and UDEL 1700, a polyether sulfone that is commercially available from Union Carbide.

Suitable methods to apply the removable layer to the electronic device include spray coating, spin coating, roll coating, meniscus coating, dip coating, transfer coating, jetting, drop dispensing, pattern print depositing, or dry film laminating. The removable layer may have a thickness of greater than about 5 micrometers. In one embodiment, the removable layer has a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers. In another embodiment, the removable layer has a thickness less than about 100 micrometers.

The removable layer may be applied to the electronic device while the electronic device is in a single component form, or when the electronic device is in a panel or wafer format. For example, if the electronic device is a semiconductor chip, the removable layer may be applied either at the wafer level, or after the wafer processing is complete and after wafer sawing. The wafer may be sawed into two or more individual chips using semiconductor wafer dicing equipment. The chips may be rinsed to remove sawing debris. Alternatively, the removable layer may be applied directly onto singulated chips after wafer sawing. If the removable layer is applied at wafer level, it may be deposited onto one wafer by spin coating or spray coating. If the removable layer is applied to singulated chips, spray coating or drop dispensing may apply the removable layer. In a small packaged electronic device, such as an area array chip scale component, where the electronic device may be fabricated in a panel with multiple devices handled together, the removable layer may be applied to the devices while still in the panel via roll coating, meniscus coating or by another batch application method.

The removable layer is applied to partially cover the first surface of the electronic device, thereby leaving the I/O contacts uncoated. If desired, additional areas on the electronic device may be left uncoated. This may be accomplished by direct dispense systems such as jetting, or by stencil or screen printing standard assembly processing steps used to selectively apply solder mask resins onto boards, substrates or components. The removable layer may be applied to the electronic device prior to or subsequent to the application of the first and second metal layers to the electronic device.

If areas on the electronic device in addition to the I/O contacts are left uncoated by the removable layer, the corresponding additional areas on the second surface of the base insulative layer should be left uncoated by the adhesive layer. Specifically, the adhesive layer should be applied to selective areas of the electronic device mounting site on the base insulative layer, so that areas on the first surface of the electronic device that are not coated with the removable layer or first metal layer, do not come in contact with the adhesive when the electronic device is placed against and bonded to the base insulative layer.

In one embodiment of forming the removable layer, a thermoplastic polymer is deposited onto the electronic device in liquid form and then dried. The thermoplastic polymer may be applied in liquid form, or may be deposited as part of a liquid solution, e.g. mixed with a solvent. In one example, a suitable solution is formed by adding together CIBY GEIGY XU 412 as a 4.1% by weight solution of 2.5% by weight DMAC (dimethyl acetamide), 27.3% by weight anisole, and 66.1% by weight γ-butyrolactone (GBL). A droplet of this material may be dispensed onto the electronic device in sufficient volume to produce a coating having a thickness in a range of from about 100 micrometers to about 1000 micrometers. After the liquid thermoplastic polymer is deposited, the material may be dried in a sequential series of thermal steps. An example of suitable thermal steps may be 10 to 20 minutes at about 150 degrees Celsius, 10 to 20 minutes at about 220 degrees Celsius, and 10 to 20 minutes at about 300 degrees Celsius. The number and duration of the thermal steps, as well as the temperatures used will depend on the particular thermoplastic polymer that is utilized. This drying sequence removes the solvent from the thermoplastic polymer solution, and leaves a fully dried layer of the thermoplastic polymer on the electronic device, thereby forming the removable layer.

Another factor to consider is the pressure that is applied to the parts during cure. Naturally, more pressure will produce a thinner bond line. If more pressure is needed than a sufficiently thick bondline will allow, spacer material may be added to the adhesive to control the bondline thickness. The spacer material may be selected to be further functional insofar as it may have, as an inherent property, desirable thermal conductivity and electrical resistivity.

If the removable layer is a curable material, after the removable layer is formed it may be cured. The removable layer may be cured thermally, by radiation, or by a combination of heat and radiation. Suitable radiation may include ultraviolet (UV) light, electron beam, and/or microwaves. The cured removable layer should be sufficiently transparent in the visible wavelengths so that automated vision systems at wafer sawing and at chip pick and place can distinguish wafer saw lanes. This transparency enables alignment of the saw during wafer sawing and alignment of the chip or other electronic device during placement. In addition, the cured removable layer should be laser drillable at the wavelength used to ablate vias through the base insulative layer. For example, the cured removable layer is desirably laser drillable.

Following application of the adhesive layer, the adhesive layer may be cured. The adhesive layer is partially cured until the adhesive is at a B-stage point, where it is not fully cured but stable enough for further handling. The adhesive layer may be cured thermally or by a combination of heat or radiation. Suitable radiation may include UV light and/or microwaves. A partial vacuum may be used to promote the removal of volatiles from the adhesive during cure if any are present.

One or more first metal layers are applied to the first surface of the electronic device. Specifically, each first metal layer is applied to a surface of an I/O contact located on the electronic device. Each first metal layer has a first surface and a second surface, and the first surface of the first metal layer is located directly on the I/O contact. The perimeter of each first metal layer substantially corresponds to the perimeter of the I/O contact the first metal layer is disposed on. In a completed interconnect structure, each first metal layer is located adjacent to the removable layer and has a thickness that is substantially equivalent to the thickness of the removable layer. The first metal layer may be comprised of lead, silver, tin, platinum, copper, lanthanum; and/or a non-metallic material such as arsenic, phosphorus or sodium; or a combination of two or more thereof. In a preferred embodiment, the first metal layer comprises lead.

One or more second metal layers may also be applied to the first surface of the electronic device. Each second metal layer is applied to the second surface of a first metal layer. The perimeter of each second metal layer substantially corresponds to the perimeter of the first metal layer and I/O contact the second metal layer is disposed on. In a completed interconnect structure, each second metal layer is located adjacent to the removable layer, and the combined thickness of the first and second metal layers is substantially equivalent to the thickness of the removable layer. The second metal layer may be comprised of lead, copper, silver, cadmium, tin, thallium, zinc, or a combination of two or more thereof. In addition, the first and/or second metal layers may be comprised of the following binary systems: silver-lead, tin-copper, tin-silver, lead-silver, arsenic-cadmium, lead-cadmium, platinum-cadmium, copper-lead, lanthanum-tin, phosphorus-thallium, platinum-lead, lead-zinc, and platinum-thallium.

Suitable methods for applying the first and second metal layers to the electronic device include plating, evaporation, and sputtering. The first and second metal layers may each be applied to the electronic device prior to or subsequent to the application of the removable layer to the electronic device.

Referring to FIG. 1(a), in one embodiment of the invention a base insulative layer 10 has a first surface 12 and a second surface 14. The base insulative layer is secured to a frame structure (not shown) to provide dimensional stability to the insulative layer during processing. The base insulative layer is formed from an electrically insulating material. Further, the base insulative layer may be a polymer film to which an electrically conductive material can be secured.

As shown in FIG. 1(b), an adhesive layer 16 may be applied to the second surface of the base insulative layer. The adhesive layer can bond to an electronic device 18 (see FIG. 1(c)). The adhesive layer can thus secure or bond the electronic device to the base insulative layer.

As shown in FIG. 1(c), the electronic device has a first surface 20 and a second surface 22. The first surface of the electronic device may be the active surface of the device upon which one or more I/O contacts 23 are located. Examples of I/O contacts, which may be located on the electronic device, include pads as shown in the illustrated embodiment. A passivation layer 21 may be deposited on at least a portion the first surface of the electronic device. The passivation layer protects the active regions of the electronic device and exposes the I/O contacts. The passivation layer may be comprised of benzocyclobutene (BCB), silicon oxide, silicon nitride, or polyimide.

Suitable electronic devices may be a packaged or unpackaged semiconductor chip such as a microprocessor, a microcontroller, a video processor, or an ASIC (Application Specific Integrated Circuit); a discrete passive; or a ball grid array (BGA) carrier. In one embodiment, the electronic device is a semiconductor silicon chip with an array of I/O contact pads disposed on its first surface.

Figure 2:
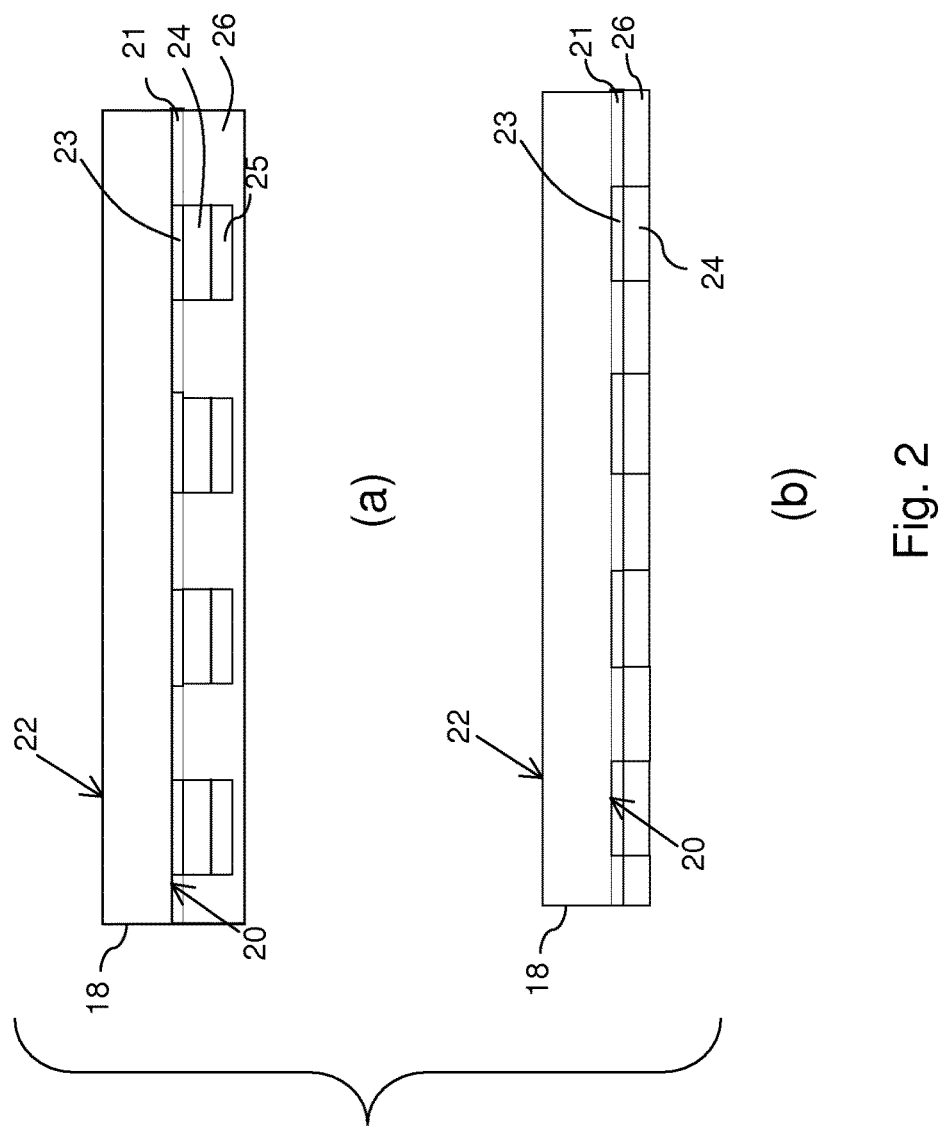
FIG. 2(a) is a cross-sectional side view of an electronic device according to an alternative embodiment of the invention.
FIG. 2(b) is a cross-sectional side view of an electronic device according to an alternative embodiment of the invention.

Referring further to FIG. 1(c), a plurality of first metal layers 24, a plurality of second metal layers 25, and a removable layer 26, are applied to the first surface of the electronic device. In one embodiment as depicted in FIG. 1(c), the removable layer is applied to the first surface of the electronic device in regions not covered by the first metal layer or the second metal layer. In another embodiment as depicted in FIG. 2(a), the removable layer is applied over the full first surface of the electronic device, thus covering the first and second metal layers. Alternatively, a removable layer and only a plurality of first metal layers may be applied to the electronic device as shown in FIG. 2(b). Subsequently, the electronic device subassembly may be assembled onto the base insulative layer.

In one embodiment, the active or first surface of the electronic device may be placed in contact with the second surface of the base insulative layer, whereby the active surface of the electronic device having the removable layer and first and second metal layers thereon, is placed in contact with the adhesive layer (see FIG. 1(d)). For example, the base insulative layer may be placed on a heated stage of an automated Pick and Place system that picks each electronic device, in this case a chip, off of a diced wafer or off of a tray of singulated chips such as a waffle pack. The partially cured adhesive layer is heated whereby the adhesive is softened and made tacky, but is not cured. The chips are then placed with their first surface down, so that the active surface of the chip is placed against the second surface of the base insulative layer, and whereby the I/O contacts of each chip are preferably aligned to fiducials on the base insulative layer (see FIG. 1(d). The fiducials may be inks, patterned metal, through holes, or other features formed on either the first or second surface of the base insulative layer.

Figure 3:
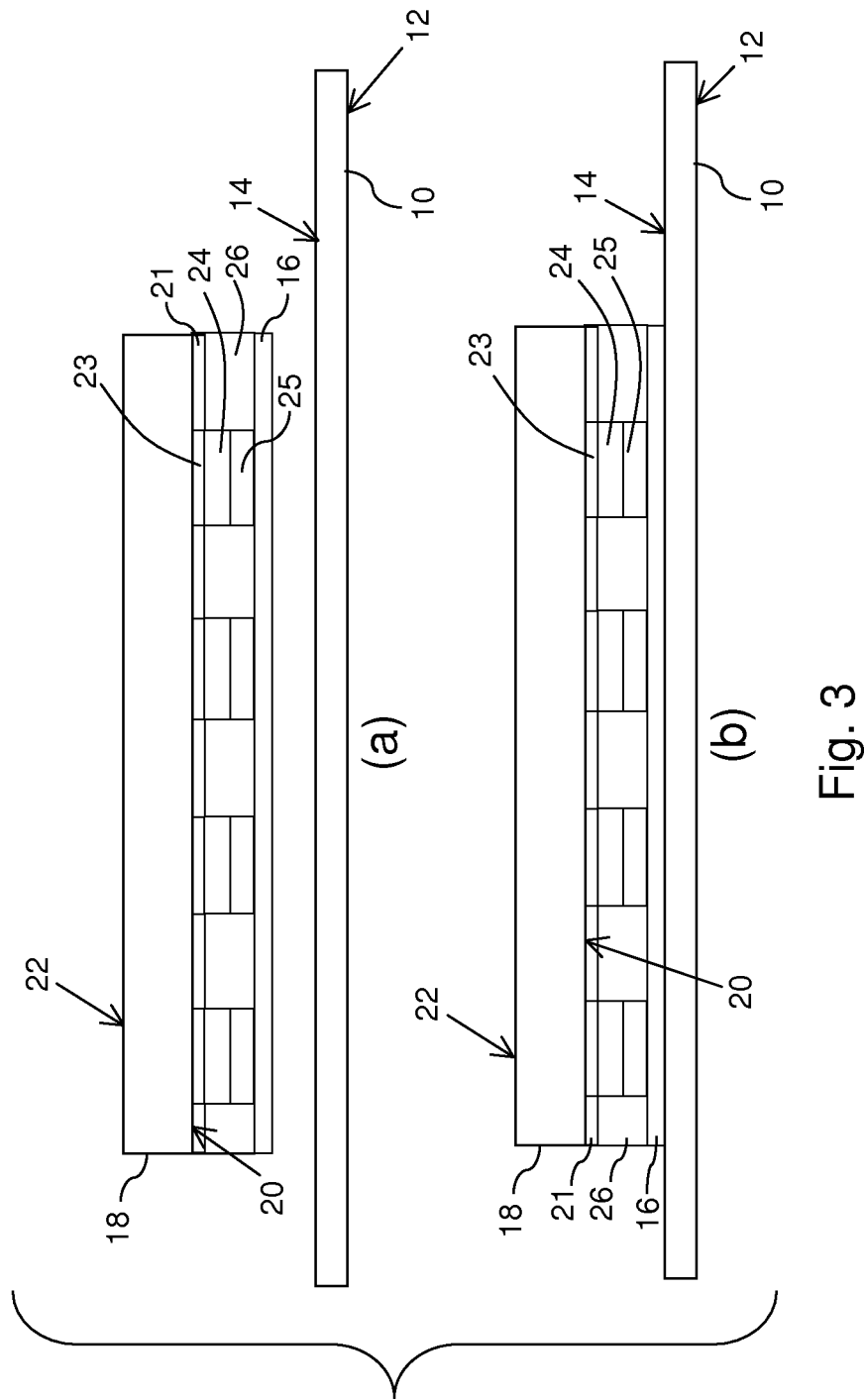
FIGS. 3(a)-3(b) are cross-sectional side views of an electronic device being bonded to a base insulative layer according to an alternative embodiment of the invention.

In one embodiment, illustrated in FIG. 3(a), a removable layer and a plurality of first and second metal layers are applied to the first surface of an electronic device. The removable layer may be applied to the electronic device and cured as described above in the first embodiment. An adhesive layer may be applied to the first surface of the electronic device on top of the removable layer and first and second metal layers, and is used to bond the electronic device to the base insulative layer as shown in FIG. 3(a). Suitable application methods are the same as described hereinabove.

Referring to FIG. 3(b), the active or first surface of the electronic device, having the removable layer, first and second metal layers, and adhesive layer thereon, may be placed in contact with the second surface of the base insulative layer. The base insulative layer has been secured to a frame structure to provide dimensional stability to the insulative layer during processing. In an automated system, the base insulative layer may be placed on a heated stage of an automated Pick and Place system that picks each electronic device, in this case a chip, off of a diced wafer or off of a tray of singulated chips such as a waffle pack. The chips are heated whereby the partially cured adhesive layer is softened and made tacky, but is not cured. The chips are then placed with the electronic device first surface contacting against the second surface of the base insulative layer, and whereby the I/O contacts of each chip are preferably aligned to fiducials on the base insulative layer as described hereinabove. The adhesive layer may be fully cured as described hereinabove.

To recover the electronic device from the interconnect structure and base insulative layer, an encapsulation step may be delayed until a final processing step. However, if the electronic device is left unencapsulated on the base insulative layer during processing, the base insulative layer may be subject to patterning issues due to the non-planarity of the unencapsulated surface.

Figure 4:
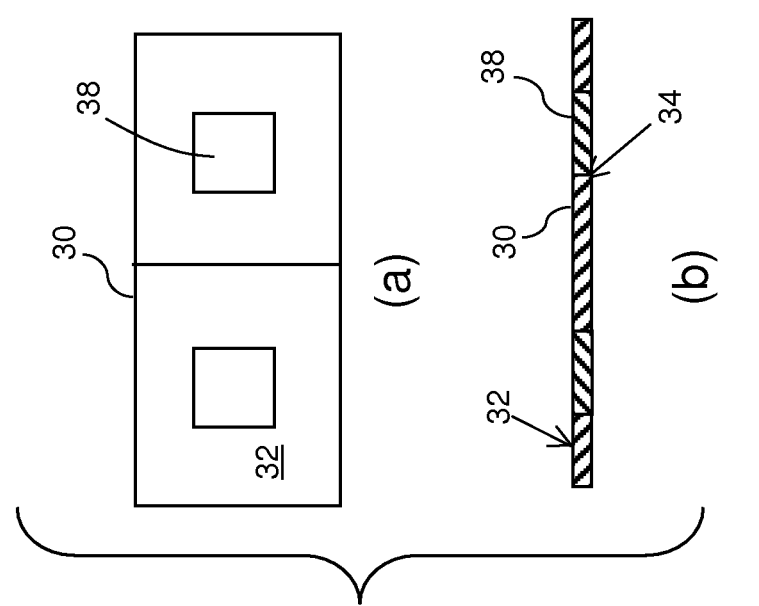
FIG. 4(a) is a top view of a frame panel.
FIG. 4(b) is a cross-sectional side view of a frame panel.

The base insulative layer secures to a frame panel to provide dimensional stability to the base insulative layer during processing. Referring to FIG. 4, in one embodiment, a frame panel 30 has a first surface 32 and a second surface 34. The frame panel has a surface that defines an aperture or an opening 38 for each electronic device site on the base insulative layer (see FIGS. 4(a) and 4(b)).

Figure 5:
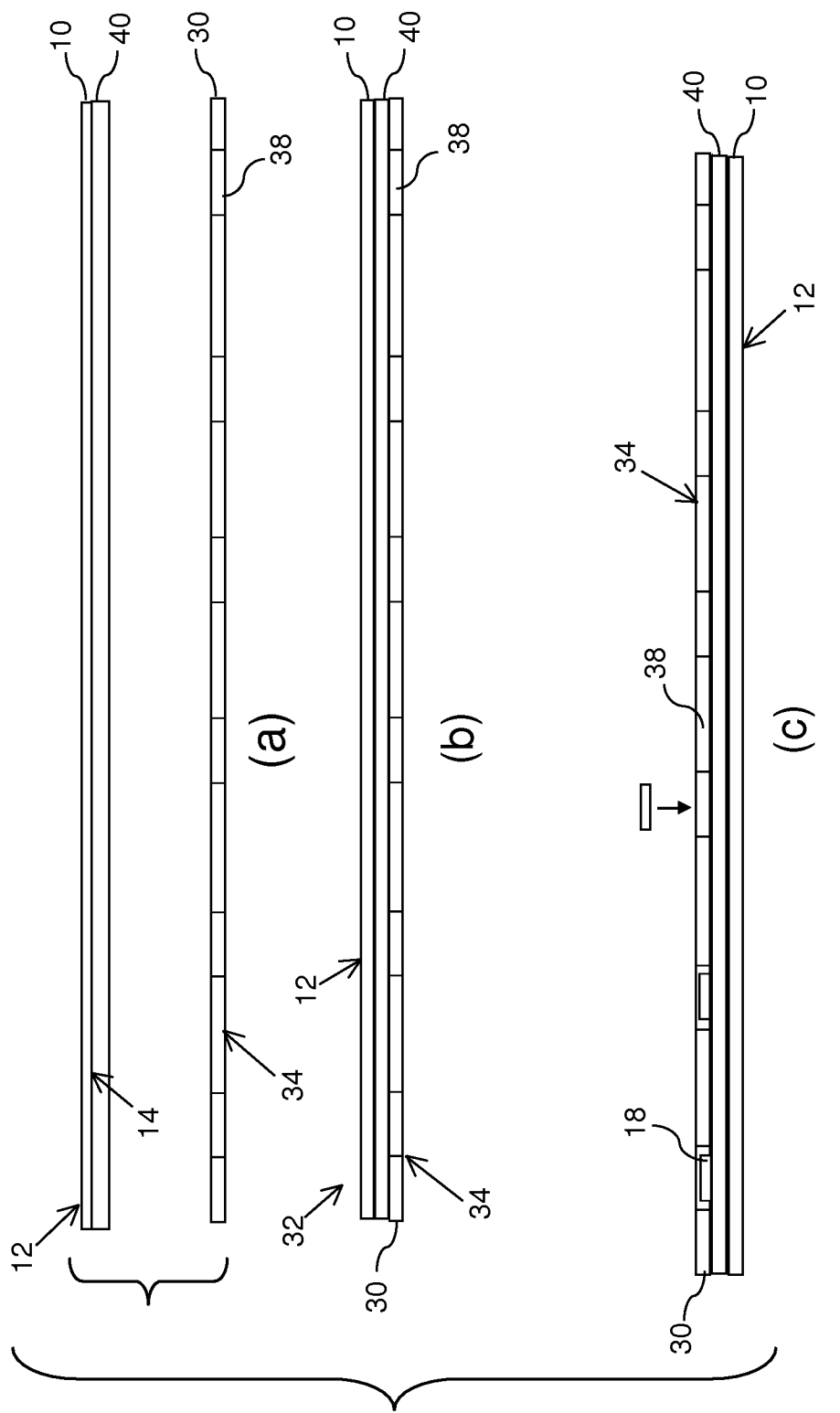
FIGS. 5(a)-5(b) are cross-sectional side views of a frame panel being bonded to a base insulative layer according to an alternative embodiment of the invention.
FIG. 5(c) is a cross-sectional side view of an electronic device being placed within a frame panel on a base insulative layer according to an alternative embodiment of the invention.

The base insulative layer may secure to the frame panel as shown in FIG. 5. The frame panel stabilizes the base insulative layer instead of, or in addition to, the frame structure (described hereinabove) during fabrication of the interconnect structure. Furthermore, the frame panel may increase the planarity of the unencapsulated surface of the base insulative layer during processing. The frame panel may be a relatively permanent component of the interconnect structure. As shown in FIG. 5(a), the frame panel may be large enough to comprise a plurality of openings 38, wherein each opening is for a different electronic device site on the base insulative layer, and whereby the frame panel provides stability and increased planarity to a plurality of electronic device sites. Alternatively, the frame panel may comprise a single opening and be sized to provide stability and increased planarity to one electronic device site on the base insulative layer.

A suitable frame panel may be formed from a metal, ceramic, or a polymeric material. Suitable polymeric materials may include a polyimide, or an epoxy or epoxy blend. The polymeric material may include one or more reinforcing fillers. Such filler may include fibers or small inorganic particles. Suitable fibers may be glass fibers or carbon fibers. Suitable particles may include silicon carbide, boron nitride, or aluminum nitride. The frame panel may be a molded polymer structure. In one embodiment, the frame panel is a metal selected from titanium, iron, copper or tin. Alternatively, the metal may be an alloy or metal composite, such as stainless steel or Cu:Invar:Cu. The specific materials from which the frame panel is formed may be selected for a particular design based on the desired coefficient of thermal expansion, rigidity, or other desired mechanical properties. The frame panel may have a metal coating. Suitable metal for coating may include nickel. The frame panel may have a polymer coating. Suitable polymer coating materials may include polyimide, which may improve adhesion.

The frame structure and/or frame panel may stabilize the base insulative layer during processing. However, the use of a frame structure or frame panel may not be required. For example, roll-to-roll processing may not require the use of a frame structure or frame panel.

The frame panel may have a coefficient of thermal expansion (CTE) that is greater than about 10 ppm/° C. The frame panel may have a coefficient of thermal expansion (CTE) that is less than about 20 ppm/° C. In one embodiment, the frame panel may have a thickness equal or close to the thickness of the electronic device. In another embodiment, the frame panel may have a thickness significantly greater than the thickness of the electronic device. In embodiments wherein multiple electronic devices with varying thicknesses are placed in the electronic device sites, the frame panel may have a thickness equal or close to the thickness of the thickest electronic device or alternatively significantly greater than the thickness of the thickest electronic device.

In one embodiment, the first surface of the frame panel secures to the second surface of the base insulative layer (see FIGS. 5(a) and 5(b)). The base insulative layer may bond to the frame panel using an adhesive layer 40. Suitable adhesives for bonding the frame panel to the base insulative layer include at least those materials listed hereinabove as suitable adhesive materials. Suitable application methods include those listed hereinabove.

In one embodiment, the frame panel is secured to the base insulative layer before the electronic devices are secured to the base insulative layer, as shown in FIG. 5(c).

Figure 6:
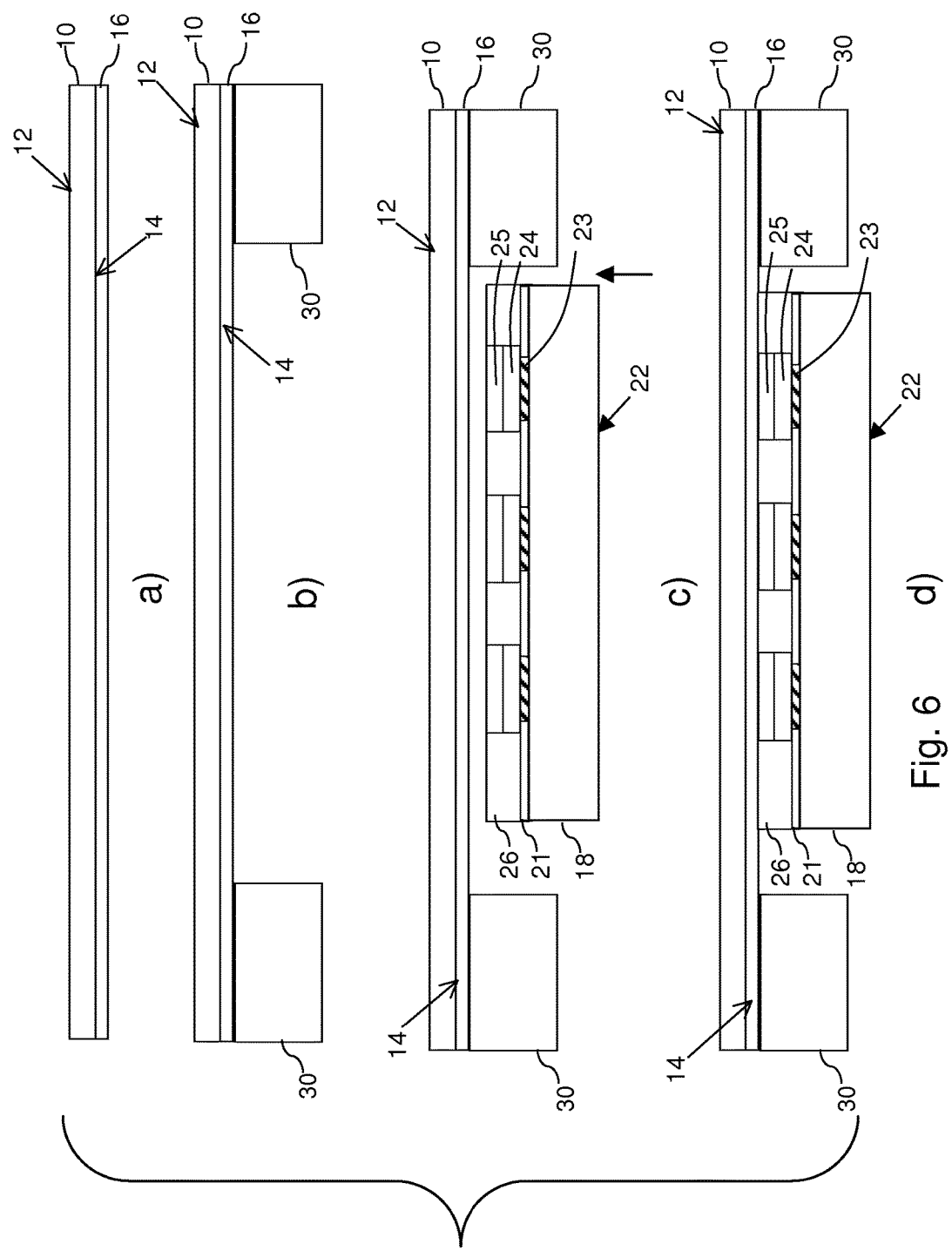
FIGS. 6(a)-6(d) are cross-sectional side views of an electronic device being bonded to a base insulative layer and within a frame panel in accordance with an alternative embodiment of the invention.

In addition, if the adhesive layer used to bond the frame panel to the base insulative layer is the same as the adhesive layer used to bond the electronic device to the base insulative layer, the electronic device and frame panel may be placed onto the base insulative layer and cured at the same time. This may simplify or reduce the number of processing steps. For example, as illustrated in FIG. 6, the second surface of the base insulative layer 14 is coated with a thermoset adhesive layer 16, and the adhesive material is cured to a B-stage. The second surface of the base insulative layer is laminated to the first surface of the frame panel 30 as shown in FIG. 6(b). An electronic device 18 having a removable layer and first and second metal layers already secured thereto, is placed on the second surface of the base insulative layer within an opening in the frame panel 30 (see FIGS. 6(c) and 6(d)). The adhesive layer is fully cured to bond both the frame panel and the electronic device to the base insulative layer.

If the adhesive layer is applied to the first surface of the electronic device as depicted in FIGS. 3(a) and 3(b), a frame panel adhesive may be used to secure the first surface of the frame panel to the second surface of the base insulative layer. The frame panel adhesive layer 40 may be applied selectively to regions of the second surface of the base insulative layer that contact the frame panel or alternatively, the frame panel adhesive may be applied to the first surface of the frame panel. Suitable adhesives for bonding the frame panel to the base insulative layer include at least those materials listed hereinabove as suitable adhesive materials. Suitable application methods include those listed hereinabove.

Each opening in the frame panel may be in a range of from about 0.2 millimeters (mm) to about 5 mm larger in the x and y dimensions than the electronic device. This size multiplier may facilitate a subsequent placement of the electronic device onto the base insulative layer. Alternatively, the frame panel may be placed onto the base insulative layer after the electronic device is placed and/or bonded onto the base insulative layer.

Figure 7:
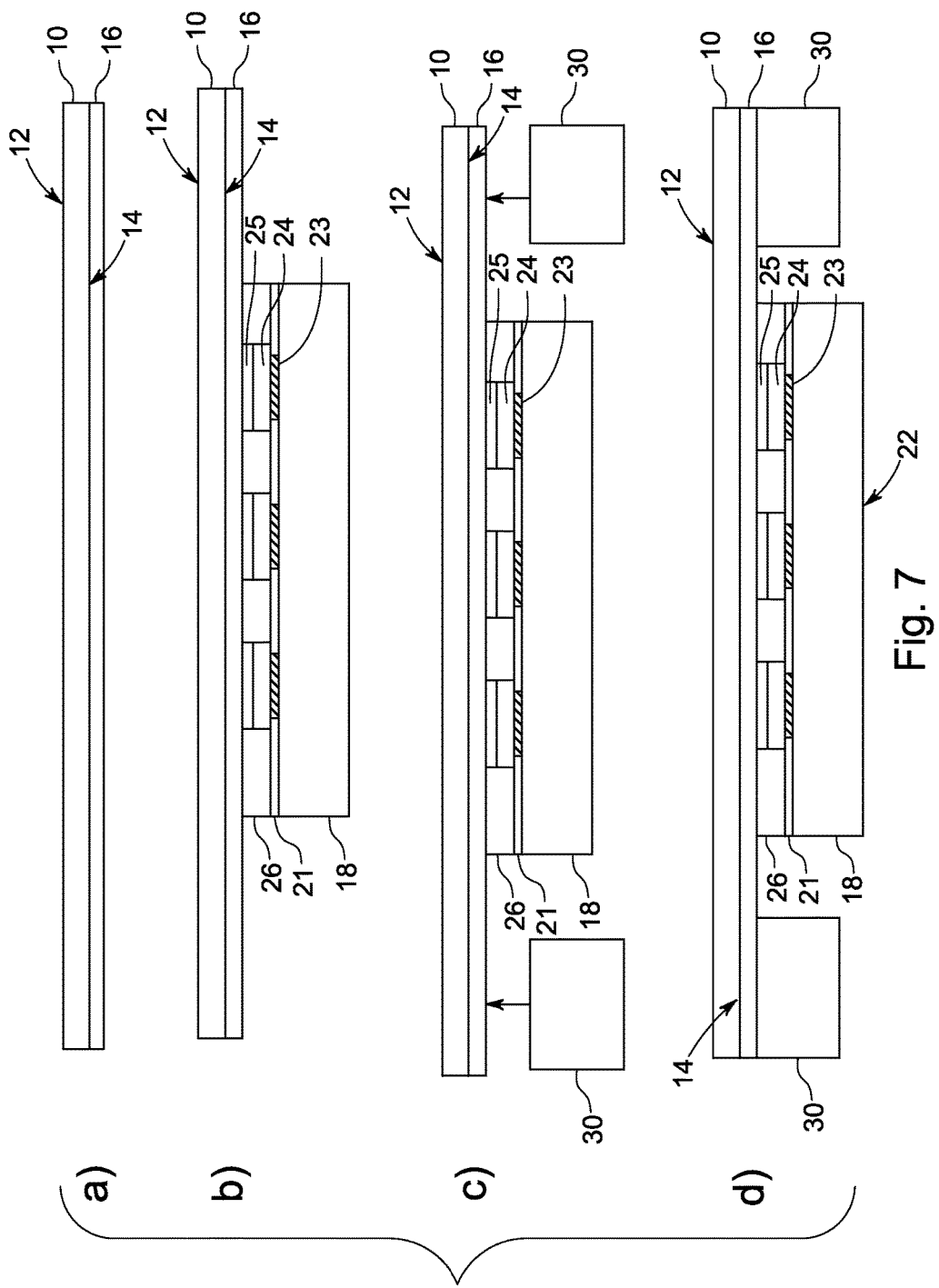
FIGS. 7(a)-7(d) are cross-sectional side views of an electronic device and a frame panel being bonded to a base insulative layer according to an alternative embodiment of the invention.

Referring to FIG. 7(a), for example, the second surface of a base insulative layer is coated with an adhesive layer and the adhesive is cured to a B-stage. An electronic device with a removable layer, first metal layer, and second metal layer thereon is placed onto the second surface of the base insulative layer as shown in FIG. 7(b). The second surface of the base insulative layer is laminated to the first surface of the frame panel as displayed in FIGS. 7(c) and 7(d). The electronic device is disposed within an opening in the frame panel. Lastly, the adhesive layer is fully cured to bond the frame panel and the electronic device to the base insulative layer.

In one embodiment, a sub-assembly includes a barrier coating disposed between the adhesive layer and the removable layer, and between the adhesive layer and first and second metal layers to form a sandwich. The barrier coating may block migration of reactive species from the adhesive layer to the removable layer, first metal layer and second metal layer, and may prevent the adhesive layer from reacting with the removable layer, first metal layer and second metal layer during processing. Such a reaction, were it to occur, may cause a weak interface or defect point between the adhesive layer and the removable layer, or between the adhesive and the first or second metal layer. For example, a thermoset adhesive layer may react with the thermoplastic material of the removable layer during high temperature processes, such as curing.

The barrier coating may be applied to an outward facing surface ("on top of") the removable layer and first and second metal layers, after the removable layer and first and second metal layers have been applied to the electronic device. The barrier coating may be either an organic or an inorganic layer. In the embodiment where an organic barrier coating is used, it may be applied to the base insulative layer or electronic device by a method indicated herein as suitable for the application of either the adhesive layer or the removable layer, including, but not limited to chemical vapor deposition, plasma deposition, or reactive sputtering. In the embodiment where an inorganic barrier coating is used, it may be deposited by CVD, evaporation or sputtering for example. The barrier coating may be applied at the wafer level, after the wafer processing is complete and prior to wafer sawing. Alternatively, the barrier coating may be applied onto singulated chips after wafer sawing.

The barrier coating may include one or more organic materials selected from polyolefins, polyesters, or amorphous hydrogenated carbon. Other suitable barrier coatings may be formed from inorganic materials, such as $Ta_2O_5$, $Al_2O_3$, $Sb_2O_3$, $Bi_2O_3$, $WO_3$, or $ZrO_2$.

In one embodiment, an electrical connection between the electronic device and the base insulative layer is formed after the electronic device bonds to the base insulative layer. Specifically, an electrical connection is made between the I/O contact(s) located on the electronic device and the electrical conductor(s) located on the base insulative layer.

Figure 8:
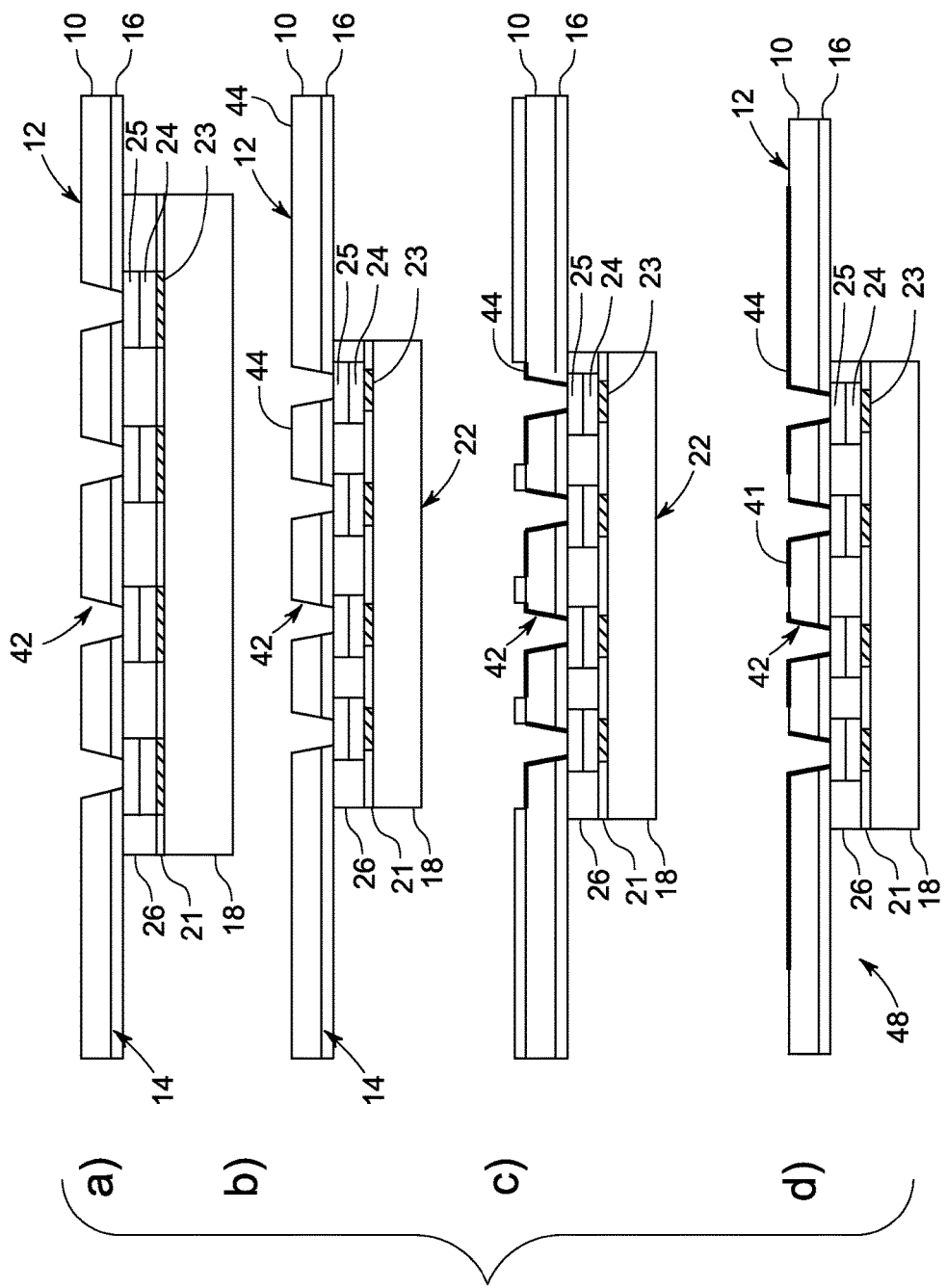
FIGS. 8(a)-8(d) are cross-sectional side views of via formation and metallization of the base insulative layer in accordance with an embodiment of the invention.

Referring to FIG. 8, suitable electrical conductors 41 that may be located on the base insulative layer include pads, pins, bumps, and solder balls. The electrical connection between the base insulative layer and the electronic device may be a structure selected based on application specific parameters. For example, apertures, holes, or vias 42 may be created through the base insulative layer and adhesive layer, to one or more first metal layers or second metal layers on the electronic device (see FIG. 8(a)). Alternatively, if the removable layer is applied over the first metal layer and the second metal layer as depicted in FIG. 2(a), then the apertures, holes, or vias 42 may be created through the base insulative layer, adhesive layer, and removable layer to one or more first metal layers or second metal layers on the electronic device. Laser ablating, wet chemical etching, plasma etching, or reactive ion etching may form the vias. In one embodiment, the vias may be sized so that they are micro-vias.

Via diameters may be less than about 10 micrometers. In one embodiment, via diameter is in a range of from about 10 micrometers to about 20 micrometers, from about 20 micrometers to about 30 micrometers, from about 30 micrometers to about 40 micrometers, from about 40 micrometers to about 50 micrometers, or greater than about 50 micrometers.

If a laser ablation technique forms the vias, the base insulative layer may be supported by a frame structure, and may be turned over and placed onto an automated laser system. The laser system may be programmed to laser ablate the base insulative layer in selected locations. This process forms at least one blind via through the base insulative layer and adhesive layer to the second metal layer disposed on an I/O contact on the electronic device 18. If a second metal layer is not deposited on the I/O contact, the via will extend to the first metal layer. If desired, the laser ablation may be followed by a de-smear or de-scum process that removes residue ash and residue adhesive layer in the via to expose the first metal layer or second metal layer on the electronic device. This step may be performed by Reactive Ion Etch (RIE), plasma clean or wet chemical etch. If desired, traces, power planes or ground planes may be formed on the first surface of the base insulative layer.

Referring to FIG. 8(*b*), electrically conductive material, indicated by reference number 44, may be disposed into the vias extending to one or more first metal layers or second metal layers disposed on the I/O contacts on the electronic device, and onto the first surface of the base insulative layer 10. The electrically conductive material may be an electrically conductive polymer, and may be deposited by jetting or by screening. Examples of suitable electrically conductive materials may include an epoxy, polysulfone, or polyurethane that incorporates metal particle fillers. Suitable metal particles include silver and gold. Other suitable metals may include Al, Cu, Ni, Sn, and Ti. Rather than filled polymeric material, inherently conductive polymers may be used. Suitable conductive polymers include polyacetylene, polypyrrole, polythiophene, polyaniline, polyfluorene, Poly-3-hexylthiophene, polynaphthalenes, poly-p-phenylene sulfide, and poly-p-phenylene vinylene. If viscosity and stability issues are addressed, the inherently conductive polymer may be filled with an electrically conductive filler to further enhance the electrical conductivity.

If the conductive material is metal, the conductive material may be deposited by methods including one or more of sputtering, evaporating, electroplating, or electroless plating. In one embodiment, the first surface of the base insulative layer and the exposed surface of the vias extending to the second metal layers, are metallized using a combined sputter plate and electroplate sequence. The base insulative layer is placed in a vacuum sputter system with the first surface of the base insulative layer and the vias exposed to the sputter system. A backsputter step sputter-etches the exposed second metal layer to remove residual adhesive material and native metal oxide. Further, backsputter step etches into the base insulative layer surface. The sputter etch of the first metal layers or second metal layers reduces contact resistance of the subsequent metallization steps while the etching of the base insulative layer may increase the metal adhesion to the first surface of the base insulative layer.

As shown in FIG. 8(*b*), a seed metal layer 44 is sputter deposited onto the first surface of the base insulative layer, onto the sidewalls that define the via, and onto the exposed first metal layers or second metal layers. A dual-metal system containing a barrier metal such as Ti or Cr, and a non-barrier metal such as Cu or Au may be used. The barrier metal can plate to a thickness in a range of from about 1000 Å to about 3000 Å, and the non-barrier metal can plate to a thickness in a range of from about 0.2 micrometers to about 2.0 micrometers. The metal deposition steps may form metal interconnections on the first surface, or the non-component side, of the base insulative layer.

Following the sputtering steps, a relatively thicker layer of the non-barrier seed metal layer is electroplated onto the base insulative layer first surface, as indicated in FIG. 8(*c*). A suitable metallization patterning process may include a semi-additive or pattern plate-up process as depicted in FIG. 8. The seed metal layer on the surfaces of the base insulative layer including the via sidewalls are electroplated with metal to form a plating layer with a thickness in a range of from about 0.5 micrometers to about 2 micrometers. A photomask material is disposed over the plating layer on the first surface of the base insulative layer and photo-patterned to expose selected regions of the surface. The photomask material is removed from areas on the first surface of the base insulative layer that are desired to retain metal, such as interconnect traces and vias. Areas of the base insulative surface that are intended to have the metal removed are left covered by the photomask material. Referring to FIG. 8(*c*), after the photomask material is patterned a thicker metal is plated on the exposed regions of the first surface of the insulative layer with a thickness in a range of from about 2 micrometers to about 20 micrometers. Because the plated-up metal will have sidewalls that follow the straight sidewalls of the patterned photoresist, the photoresist thickness should be greater than the thickness of the plated-up metal. Following the thicker metal plating, the remaining photomask material is removed, and the resulting exposed regions of thin seed metal are removed by multiple wet metal etch baths, removing plated up and sputtered metal, thereby leaving the desired metallization pattern, as shown in FIG. 8(*d*).

In one sequence, a subtractive metal patterning process is used. In this method, the plating layer is plated to a thicker layer with a thickness based upon the circuit requirements of the electronic component in a range of from about 2 micrometers to about 20 micrometers. A photomask material is disposed over the first surface of the base insulative layer, and then photo-patterned to expose selected regions of the surface. Areas on the first surface of the base insulative layer that are desired to retain metal such as interconnect traces, second metal layers, and vias are left covered with the photoresist while areas of the base insulative layer surface that are desired to have the metal removed are left uncovered. Multiple standard wet metal etch baths remove plated up and sputtered metal on the exposed base insulative layer surface regions, while the remaining areas are protected from the wet etchants by the masking material. Following completion of the etching step, the remaining photoresist material is removed. The photoresist material removal reveals the desired metallization pattern, as shown in FIG. 8(*d*). An electrical connection between the base insulative layer and the electronic device may also be formed using a solder process.

The preceding process steps complete a first interconnect layer 48 and its electrical connections to the I/O contacts of the electronic device. Interconnection to one or more complex electronic devices, including semiconductor chips such as microprocessors, video processors and ASICs (Application Specific Integrated Circuits), may require an additional interconnection layer to fully route out all of the required chip I/O contacts. For these electronic devices, one or more additional interconnect layers may be formed over the first surface of the base insulative layer. For more simple electronic devices with less routing complexity, only one interconnect layer may be required.

In one embodiment, additional interconnection layers are formed by bonding an additional insulative layer 50 to the first interconnect layer. In one embodiment indicated in FIG. 9(*a*), the additional insulative layer has a first surface 52 and a second surface 54, and is coated with an additional adhesive layer 56. Suitable adhesives for use in the invention include those materials indicated as being suitable adhesive materials hereinabove. If the additional adhesive layer includes a thermoset material, after application of the additional adhesive layer to the additional insulative layer, the adhesive is cured to a B-stage. In another embodiment, the additional adhesive layer can be applied to the first surface of the first interconnect layer. In yet another embodiment, the additional insulative layer can be applied in liquid form and cured in place on the first surface of the first interconnect layer.

Figure 9:
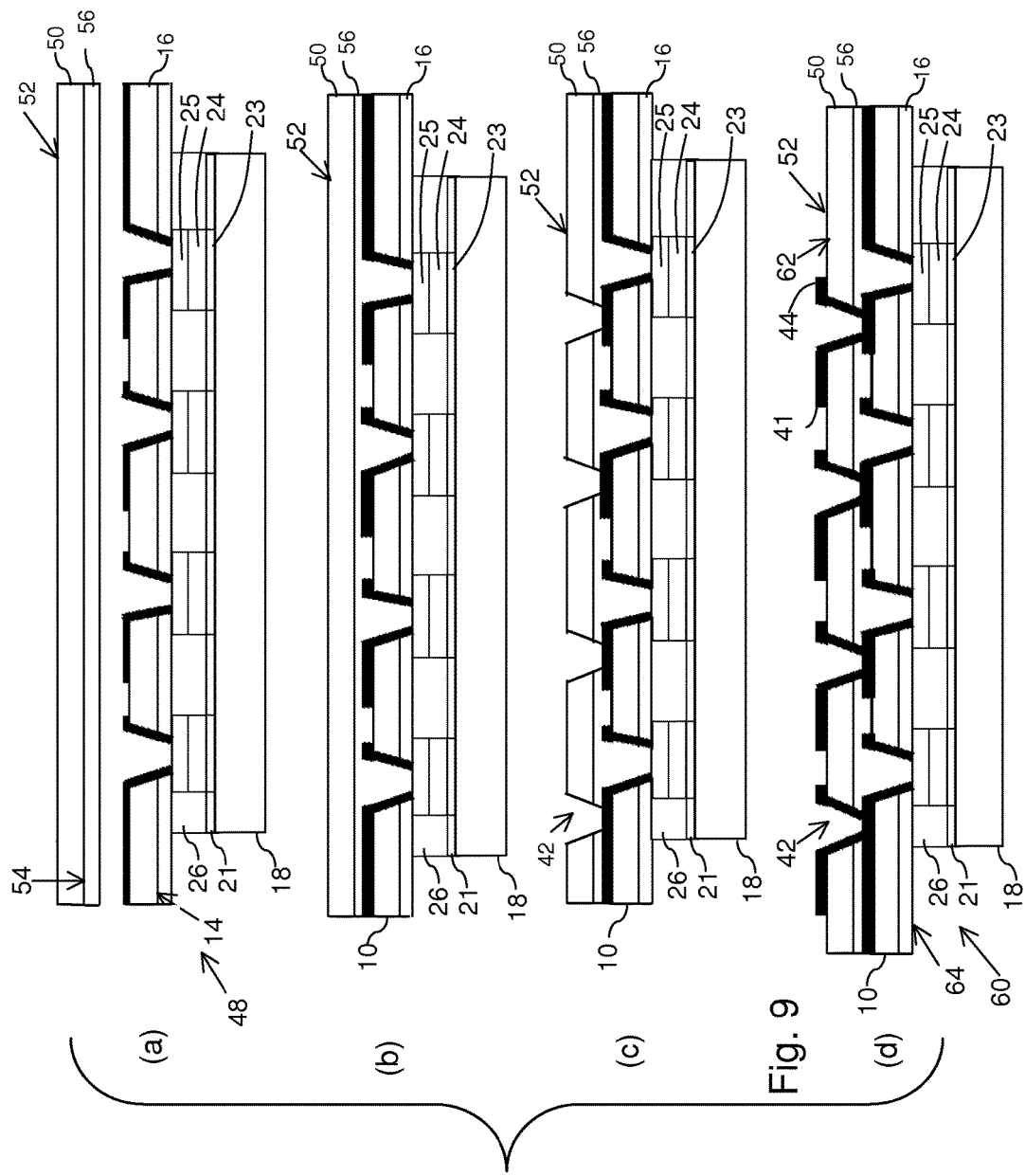
FIGS. 9(a)-9(b) are cross-sectional side views of an additional base insulative layer being bonded to an interconnect layer according to an alternative embodiment of the invention.
FIGS. 9(c)-9(d) are cross-sectional side views of via formation and metallization of an additional base insulative in accordance with an alternative embodiment of the invention.

Suitable methods to apply the additional adhesive layer to the additional interconnect layers or alternatively to the first surface of the preceding interconnect layer, include spray coating, spin coating, roll coating, meniscus coating, dip coating, transfer coating, jetting, drop dispensing, pattern print depositing, or dry film laminating. As illustrated in FIG. 9(*a*), the additional adhesive layer 56 may have a thickness of greater than about 5 micrometers. In one embodiment, the additional adhesive layer has a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers. In an alternative embodiment, the adhesive layer may be a prefabricated self-adhesive film that is applied to a surface of the additional insulative layer.

Referring to FIG. 9(*b*), the second surface of the additional insulative layer is placed in contact with the base insulative layer first surface (non-component side). The adhesive layer 56 is fully cured to bond the additional insulative layer to the base insulative layer and to interconnect layer 48. In one embodiment, the additional insulative layer is laminated over the first surface of the base insulative layer using a heated vacuum lamination system.

The electrical conductor(s) 41 on the additional insulative layer is electrically connected to the electrical conductor(s) 41 on the base insulative layer. For example, vias may be formed through the additional insulative layer and through the adhesive layer to selected electrical conductors on the base insulative layer, as shown in FIG. 9(*c*). The same process steps used to form vias and deposit electrically conducting material in the first interconnect layer, as described above, may be used to form electrically conducting vias in the additional insulative layer and adhesive layer (see FIG. 9(*d*)).

In one embodiment, the first surface of the additional insulative layer is metallized to complete the second interconnect layer using the metallization and patterning steps described above for the first interconnect layer. A plurality of additional interconnect layers may be formed in a similar manner.

Figure 10:
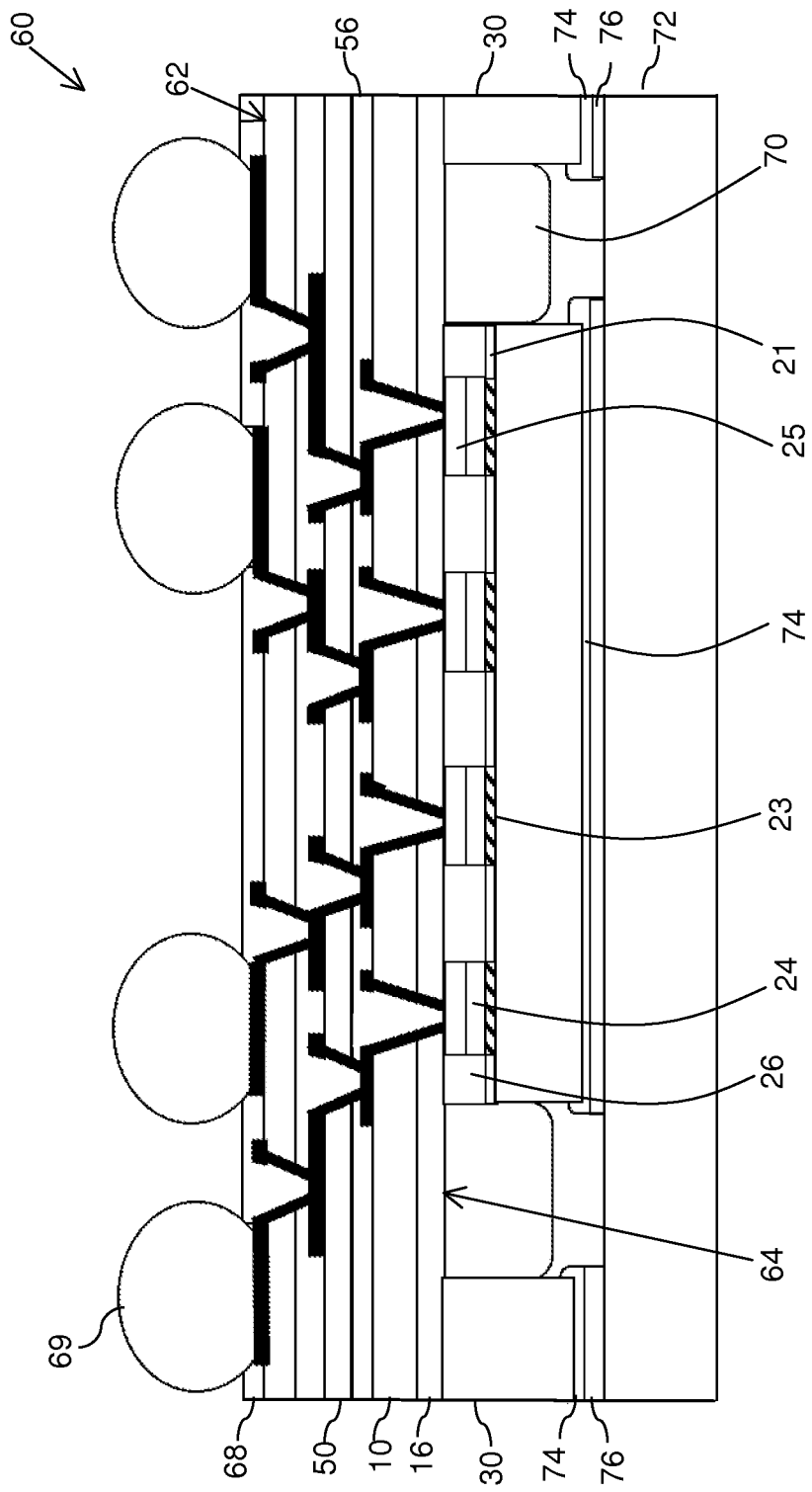
FIG. 10 is a cross-sectional side view of an interconnect assembly made in accordance with an alternative embodiment of the invention.

Multiple interconnect layers cooperate to define an interconnect assembly 60 as displayed in FIGS. 9(*d*) and 10. The interconnect assembly has a first surface 62 and a second surface 64. The interconnect assembly may be completed by coating the first surface of the assembly with a dielectric or solder masking material 68 to passivate any metal traces and to define contact pads used for assembly or package I/O contacts. The package I/O contacts may have additional metal depositions such as Ti:Ni:Au applied to the exposed contact pads to provide more robust I/O contacts. The additional metal depositions may be applied by electroless plating. The I/O contact pads can have pins, solder spheres, or leads attached to them or left as is creating a pad array. FIG. 10 depicts an interconnect assembly 60 with an array of solder spheres 69 such as for a ball grid array. Other interconnect structures may also be used. For example, an interconnect assembly may have an array of pins such as for a pin grid array.

At the completion of the interconnect structure, which can be either an interconnect layer or an interconnect assembly that includes multiple interconnect layers, a standard electrical test station determines if all of the interconnects are correct. By correct it means that the circuit is without opens or shorts. If testing indicates that an interconnect structure is defective, or another component on the interconnect structure is defective, a good electronic device may be recovered from the defective package. Alternatively, if the electronic device is found to be defective, the defective device may be removed from the interconnect structure and replaced with a new one.

In one embodiment, the removable layer, first metal layer and second metal layer may each have a softening temperature or a melt point. The removable layer, first metal layer and second metal layer each have a softening temperature or melting point between approximately 250 degrees Celsius and approximately 350 degrees Celsius. The electronic device may be recovered from the interconnect structure by heating the removable layer, first metal layer and second metal layer to its softening temperature or melt point. At that temperature, the electronic device to be released or removed from the base insulative layer and interconnect structure can be recovered. The removable layer, first metal layer and second metal layer are exposed to a heat source to soften or melt the removable layer and first and second metal layers. Using this technique, the interconnect structure may be peeled off of the electronic device, as the electronic device is firmly secured by a holding device. A suitable holding device may employ a vacuum or a mechanical clamp. The clamp may grasp the edge of the interconnect structure and remove or peel the interconnect structure from the electronic device.

The removable layer, first metal layer and second metal layer permit the electronic device to be retrieved without damage to the electronic device or the elements on its active surface. This is of particular concern with emerging semiconductor devices that use a low K (dielectric constant) interlayer dielectric because they have low mechanical strength and are damaged.

In an alternative method of removal, the interconnect structure may be mounted on a heated stage wherein a secondary heating source provides localized heating to the electronic device and the area surrounding the device. The removable layer, first metal layer and second metal layer are heated to their softening temperatures or to their melt points. If the removable layer comprises a thermoplastic or a thermoset polymer, the removable layer may be softened or melted by exposing the removable layer to a temperature that is determined by the material properties of the polymer, as long as the temperature is equal or greater than the softening temperatures or melt points of the first or second metal layers.

If a functional and undamaged electronic device is to be separated from a bad base insulative layer, the softening point or melting point temperatures of the removable layer, first metal layer and second metal layer should be lower than the maximum damage threshold temperature of the electronic device. The maximum damage threshold temperature of the electronic device is the maximum temperature the electronic device (including any circuitry thereon) can be exposed to without damaging the electronic device. Alternatively, if it is desired to remove a bad electronic device from a functional and undamaged base insulative layer, the softening point or melting point temperatures of the removable layer, first metal layer and second metal layer should be lower that the maximum damage threshold temperature of the base insulative layer. The maximum damage threshold temperature of the base insulative layer (including any circuitry thereon) is the maximum temperature the base insulative layer can be exposed to without damaging the components. Thus, from the interconnect structure, the defective electronic device or any of the defective remaining components may be removed.

In one embodiment, an interconnect structure includes a flip chip or chip scale electronic device that utilizes a relatively fine pitch (about 50 micrometers to about 1000 micrometers) array of solder spheres to electrically connect the electronic device to the base substrate to define and form the interconnect structure. Referring to FIG. 11(a), base substrate 80 such as a circuit board or flexible interconnect structure containing one or more interconnection layers has a first surface 81 and a second surface 82. A plurality of contact pads 83 are disposed on the base substrate second surface, and a passivation layer 84 may be deposited on at least a portion of the base substrate second surface. The passivation layer protects the electrical features of the base substrate and exposes the contact pads. The passivation layer may be comprised of a solder mask material such as an epoxy. A plurality of first metal layers 86, a plurality of second metal layers 87, and a removable layer 88, are applied to the second surface of the base substrate.

Referring to FIG. 11(b), electronic devices in the form of flip chip or chip scale components 90 and 90' have a first surface 92 and a second surface 93. I/O contact pads 94 are located on the first surface of the flip chip or chip scale components. Conductive elements 96 are disposed on the component I/O contacts for electrically connecting the I/O contacts to respective contact pads on the base substrate. Conductive elements may be comprised of metal, a conductive polymer or a polymer filled with conductive particles.

Referring to FIG. 11(c), the electronic devices are placed onto the base substrate, and the conductive elements form a mechanical attachment and electrical connection between the I/O contacts located on the electronic devices and the corresponding contact pads located on the base substrate. If the conductive elements are comprised of a polymer, attachment is accomplished by heating the polymer above the polymer cure temperature. Alternatively, if the conductive elements are metal, attachment is accomplished by heating the metal above its melt point. An underfill layer 98 may be disposed between the first surface of the electronic devices and the second surface of the base substrate. The underfill layer encapsulates the conductive elements after they are bonded to the substrate contact pads. Thus, the underfill bonds to the removable layer and first or second metal layer rather than to the substrate. Application of the removable layer and first and second metal layers under the electronic device mounting site permits removal of the electronic device after underfill curing has occurred. In one embodiment, the interconnect structure may mount on a heated stage. A secondary heating source applies localized heating to the electronic device and to the area surrounding the device. The removable layer connection, first and second metal layer connection, and solder connection all attaching the electronic device to the interconnect structure are heated to their softening points or melt points. This releases the removable layer, first metal layer, second metal layer, and the electronic device, and permits the electronic device to be removed from the mounting site while the thermoset underfill remains fully intact. The prior mounting site may be cleaned to remove residue or debris. Lastly, a new electronic device with conductive elements may then be mounted on the substrate, bonded to the substrate and underfilled to complete the replacement of the defective component.

If the electronic device is removed from the interconnect structure, residual adhesive layer and electrically conductive material located within the vias may remain on the electronic device. Remaining electrically conducting material or excessive residue adhesive layer on the electronic device surface, and in the vias, may be removed by wet etching, plasma etch, chemical etch or reactive ion etch, and remaining adhesive material may be removed by plasma etch, chemical etch, or reactive ion etch. In addition, if the electrically conductive material is made of metal, the portion of the conductive material remaining on the electronic device may be removed by metal etch. If the electrically conductive material includes Cu or a Ti:Cu bimetal structure, the Cu may be etched with nitric acid to leave the thin Ti metallization in place. Furthermore, any portion of the first metal layer or second metal layer remaining on the electronic device may be removed by metal etch.

After removing any remaining residual adhesive layer, electrically conductive material, first metal layer and second metal layer from the electronic device, the device is in an almost original condition and is ready to be assembled into another interconnect structure.

Chip-on-Flex, Plastic high density interconnects (HDI), high I/O count processor chips may benefit by employing embodiments disclosed herein. In the Chip-on-Flex process, a complex interconnect structure needs to be fabricated after the electronic device is bonded to the base insulative layer. It is complex in the number of layers required to route the high number of chip I/O pads, and in the complexity of each interconnect layer needed. This may have an unfortunate defect rate per interconnect structure, such as about 2% to about 10%. A yield loss of the complex interconnect structure risks scrapping the costly processor chip unless a rework process is available. Recovery by one or more of the disclosed methods may provide a relatively low stress recovery process for a bond that is stable over normal operating temperatures, can withstand high solder reflow temperatures, but is removable if an electronic component needs to be recovered from an interconnect structure.

In one embodiment, encapsulation may be delayed until the final processing step to allow for removal of the electronic device from the interconnect structure. After the interconnect layers are complete and testing of the interconnect structure is performed. If the interconnect structure and electronic device are found to be without defects, the area surrounding the electronic device may be encapsulated to further protect the electronic device and the interconnect structure from moisture and thermo-mechanical stresses. The base insulative layer and exposed electronic device may be encapsulated with encapsulation material 70 to fully embed the base insulative layer and the electronic device (see FIG. 10). In another embodiment, the base insulative layer and exposed electronic device may be partially encapsulated to embed the base insulative layer and the electronic device (see FIG. 10). In one embodiment, a potting or molding process is used to encapsulate. Suitable molding processes may include pour molding, transfer molding, or compression molding. Preferably, a dam and fill encapsulation method is utilized.

Encapsulation materials that may be used include thermoplastic and thermoset polymers. Suitable aliphatic and aromatic polymers may include polyetherimides, acrylates, polyurethanes, polypropylene, polysulfone, polytetrafluoroethylenes, epoxies, benzocyclobutene (BCB), room temperature vulcanizable (RTV) silicones and urethanes, polyimides, polyetherimides, polycarbonates, silicones, and the like. In one embodiment, the encapsulation material is a thermoset polymer due to the relatively low cure temperatures available. The encapsulation material may include a filler material. The type, size and amount of the filler material may be used to tailor various molding material properties, such as thermal conductivity, thermal coefficient-of-expansion, viscosity and moisture uptake. For example, these materials may include particles, fibers, screens, mats, or plates of inorganic particles. Suitable filler materials may include glass, silica, ceramic, silicon carbide, alumina, aluminum nitride, boron nitride, gallium, or other metals, metal oxide, metal carbides, metal nitrides, or metal silicides. Other suitable filler materials may include carbon-based materials.

If a frame panel is used, it can be applied prior to the attachment of the electronic device (see FIG. 6), after the attachment of the electronic device (see FIG. 7), or after completion of the interconnect assembly. In the latter approach, the adhesive is applied to the major surface of the frame panel and bonded to the second surface of the interconnect assembly. In all of these frame-panel-attach methods, a gap or moat region may exist between the inner edges of each frame panel opening, and the outer edge of the electronic device disposed within the opening. This gap may either be left unfilled or may be fully or partially filled with encapsulation material. The gap between the inner edges of the frame panel opening, and the outer edge of the electronic device may be partially filled so that it is between about 10% full and about 90% full. The encapsulation material may be cured. In certain embodiments, it may be beneficial to simultaneously cure the encapsulation material and the adhesive layer.

After the base insulative layer and exposed electronic device are encapsulated, a lid/thermal spreader 72 may be bonded to the second surface of the electronic device to provide thermal protection to the electronic device. The lid/thermal spreader is bonded with a thermal interface material (TIM) 74. The lid/thermal spreader may also be bonded to the second surface of the frame panel using an adhesive 76. Alternatively, the backside of the electronic device may be left exposed to facilitate heat removal during device operation for higher power devices with about 5 watts to about 100 watts or more dissipation.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

What is claimed is:

1. An electronic component, comprising:
    a base insulative layer having a first surface and a second surface;
    an electronic device having a first surface and a second surface;
    at least one I/O contact pad located on the first surface of the electronic device;
    a first metal layer disposed on the at least one I/O contact pad;
    a removable layer disposed between the first surface of the electronic device and the second surface of the base insulative layer, and located adjacent to the first metal layer; and
    an adhesive layer having a first side and an opposing second side, the first side facing the second surface of the base insulative layer and the second side facing both the first metal layer and the removable layer;
    wherein the first side of the adhesive layer is adhered onto the second surface of the base insulative layer and the second side of the adhesive layer is adhered onto the removable layer;
    wherein the base insulative layer secures to the electronic device through the first metal layer and removable layer, and the first metal layer and removable layer are capable of releasing the base insulative layer from the electronic device when the first metal layer and removable layer are exposed to a temperature higher than their softening point or melting point; and
    wherein the first metal layer has a thickness that is equal to or less than a thickness of the removable layer, with the first metal layer not extending out onto a surface of the removable layer opposite the electronic device.

2. The electronic component of claim 1, wherein the first metal layer has a perimeter substantially equal to a perimeter of the I/O contact the first metal layer is disposed on.

3. The electronic component of claim 1, wherein the removable layer is sized so as to not extend out past a perimeter of electronic device.

4. An electronic component, comprising:
    a base insulative layer having a first surface and a second surface;
    a semiconductor silicon chip having a first surface and a second surface;
    at least one I/O contact pad located on the first surface of the semiconductor silicon chip;
    first and second metal layers disposed on the at least one I/O contact pad, wherein the first metal layer is disposed directly on the at least one I/O contact pad and the second metal layer is disposed on the first metal layer;
    a removable layer disposed between the first surface of the semiconductor silicon chip and the second surface of the base insulative layer, and located adjacent to the first metal layer;
    an adhesive layer having a first side and an opposing second side, the first side adhered to the second surface of the base insulative layer and the second side adhered to the first and second metal layers and the removable layer; and
    an electrically conductive interconnect disposed within each of one or more vias extending through the removable layer and the adhesive layer, the electrically conductive interconnect extending through each of the one or more vias to the second metal layer on the semiconductor silicon chip;

wherein the base insulative layer secures to the semiconductor silicon chip through the first and second metal layers and the removable layer, and wherein the removable layer and at least one of the first and second metal layers are capable of releasing the base insulative layer from the semiconductor chip when the removable layer and first and second metal layers are exposed to a temperature higher than their softening points or melting points.

* * * * *